(12) United States Patent
Chih et al.

(10) Patent No.: US 9,275,732 B2
(45) Date of Patent: Mar. 1, 2016

(54) WRITE BUFFER FOR RESISTIVE RANDOM ACCESS MEMORY

(71) Applicant: TAIWAN SEMICONDUCTOR MANUFACTURING COMPANY LTD., Hsinchu (TW)

(72) Inventors: Yue-Der Chih, Hsinchu (TW); Chiu-Wang Lien, Hsinchu (TW); Chia-Fu Lee, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 14/284,679

(22) Filed: May 22, 2014

(65) Prior Publication Data

US 2015/0170741 A1    Jun. 18, 2015

Related U.S. Application Data

(60) Provisional application No. 61/915,648, filed on Dec. 13, 2013.

(51) Int. Cl.
*G11C 13/00* (2006.01)
*G11C 7/12* (2006.01)

(52) U.S. Cl.
CPC ........ *G11C 13/0069* (2013.01); *G11C 13/0038* (2013.01)

(58) Field of Classification Search
CPC ........... G11C 13/0069; G11C 13/0064; G11C 2013/0042; G11C 13/0007; G11C 2013/0054; G11C 2213/79
USPC ......................................... 365/145, 148, 158
See application file for complete search history.

(56) References Cited

U.S. PATENT DOCUMENTS

| | | | |
|---|---|---|---|
| 8,867,259 B2 * | 10/2014 | Kawai et al. ................... | 365/148 |
| 2012/0161821 A1 | 6/2012 | Chang et al. | |
| 2013/0070516 A1 * | 3/2013 | Tomotani et al. ............. | 365/148 |
| 2013/0148408 A1 * | 6/2013 | Kawai et al. ................ | 365/148 |

OTHER PUBLICATIONS

Official Action issued by Taiwan Intellectual Property Office (TIPO) with Ref.10421540060 on Nov. 16, 2015.

* cited by examiner

*Primary Examiner* — Richard Elms
*Assistant Examiner* — Jerome Leboeuf
(74) *Attorney, Agent, or Firm* — Chun-Ming Shih

(57) ABSTRACT

A circuit includes a current generator and a voltage generator. The current generator is configured to generate a predetermined current flowing toward a selected cell in a memory array via a node during a write operation. The voltage generator is configured to generate a predetermined voltage. The voltage level at the node is clamped at a predetermined value associated with the predetermined voltage as the selected cell is switched between a low resistance state and a high resistance state during the write operation.

20 Claims, 4 Drawing Sheets

"WRITE BUFFER FOR RESISTIVE RANDOM ACCESS MEMORY"

RELATED APPLICATIONS

This application claims priority to U.S. Provisional Patent Application No. 61/915,648, filed on Dec. 13, 2013 and entitled "Write Buffer for Resistive Random Access Memory." This application is incorporated herein by reference in its entirety.

BACKGROUND

A resistive random access memory (RRAM) device is a non-volatile memory device that stores data by varying the resistance of a resistive element. RRAM devices can have certain beneficial characteristics over other types of memory devices, such as low power consumption, high speed, and excellent bit resolution due to separation and a relatively large resistance ratio between a high resistance state (HRS) and a low resistance state (LRS), without the read/write cycle endurance limitations of charge-storage type memory.

The resistive element of an RRAM device has a current-voltage characteristic which may be varied in response to an applied voltage or current. Once the current-voltage characteristic is varied, the varied current-voltage characteristic of the resistive element may be maintained until a reset voltage or current is applied thereto. In some approaches, data may be written to a selected RRAM device by applying a predetermined voltage for a predetermined duration in a voltage-driven mode (VDM). Alternatively, data may be written by applying a predetermined current in a current-driven mode (CDM). As compared to VDM, CDM has a better on/off ratio, exhibits a relatively tight distribution of resistance, and achieves more complete dissolution of filament. When using the CDM to write an RRAM device, however, over-stress might occur in the RRAM device and cause damage thereto.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
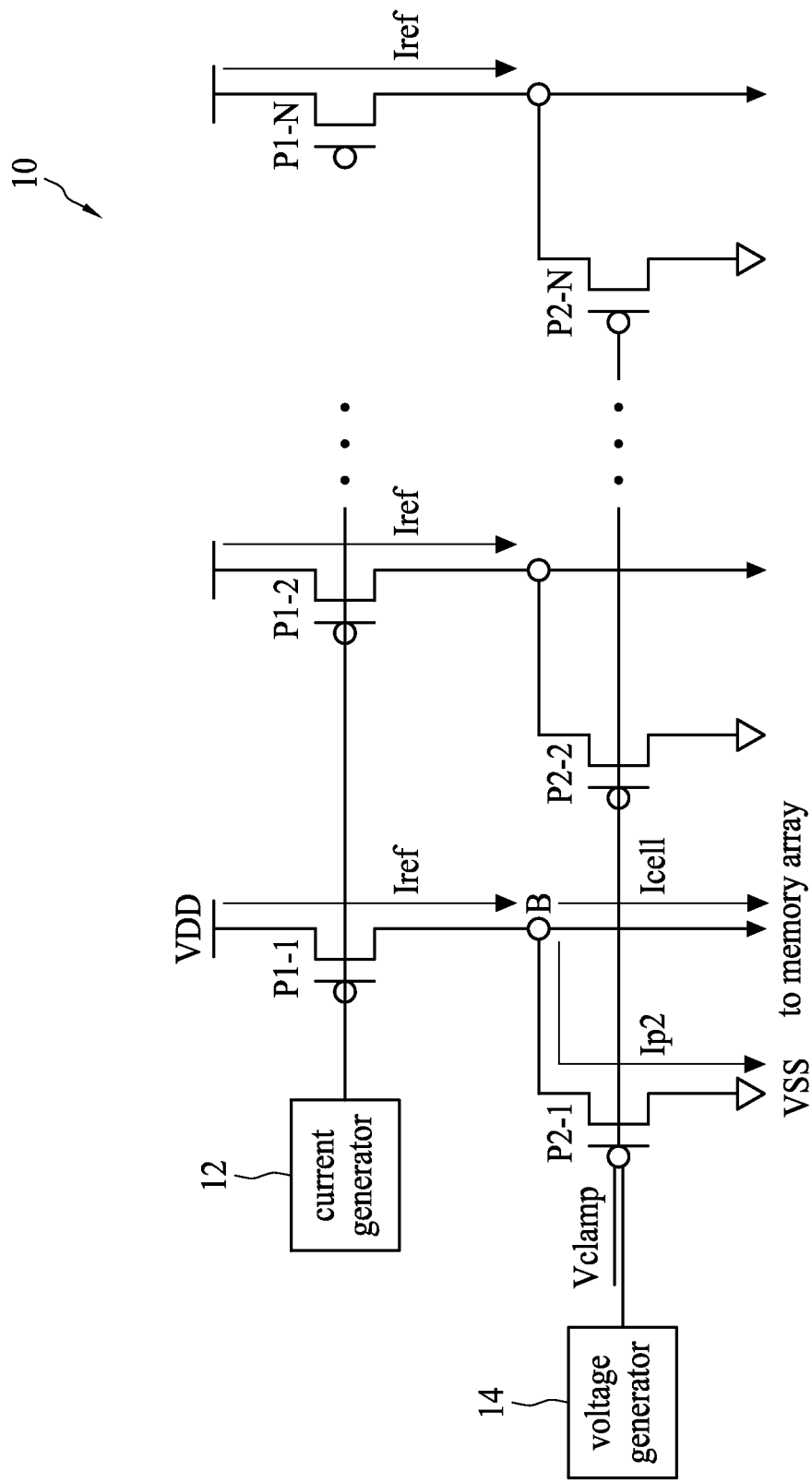
FIG. 1 is a schematic diagram of a circuit in accordance with an embodiment.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled with" another element, it may be directly connected to or coupled to the other element, or intervening elements may be present.

FIG. 1 is a schematic diagram of a circuit 10 in accordance with an embodiment. Referring to FIG. 1, circuit 10 comprises a current generator 12, a voltage generator 14, a first set of transistors P1-1 to P1-N associated with current generator 12, and a second set of transistors P2-1 to P2-N associated with voltage generator 14, N being a natural number.

Each of the first set of transistors P1-1 to P1-N includes a p-type metal-oxide-semiconductor (PMOS) transistor. Moreover, a gate (not numbered) of each of the first set of transistors P1-1 to P1-N is coupled to an output of current generator 12. A source (not numbered) of each of the first set of transistors P1-1 to P1-N receives a power supply VDD. A drain (not numbered) of each of the first set of transistors P1-1 to P1-N is coupled with a resistive random access memory (RRAM) array. In some embodiments, the first set of transistors P1-1 to P1-N are fabricated in a same manufacturing process and thus exhibit substantially the same characteristics such as threshold voltage and channel width (W) over channel length (L) ratio.

Current generator 12 is configured to generate a predetermined current. Furthermore, current generator 12 and the associated first set of transistors P1-1 to P1-N serve as a current mirror circuit. As a result, current generator 12 mirrors the predetermined current in each of the first set of transistors P1-1 to P1-N. Taking transistor P1-1 as an example, the mirrored current, labeled Iref, flows from power supply VDD at the source of transistor P1-1 via a node B at the drain of transistor P1-1 toward a selected cell in the memory array.

Each of the second set of transistors P2-1 to P2-N includes a PMOS transistor. Moreover, a gate (not numbered) of each of the second set of transistors P2-1 to P2-N is coupled to an output of voltage generator 14. A source (not numbered) of each of the second set of transistors P2-1 to P2-N is coupled to the drain of a corresponding one of the first set of transistors P1-1 to P1-N. A drain (not numbered) of each of the second set of transistors P2-1 to P2-N receives a reference voltage VSS, for example, a ground voltage. In some embodiments, the second set of transistors P2-1 to P2-N are fabricated in a same manufacturing process and thus exhibit substantially the same characteristics.

Voltage generator 14 is configured to generate a predetermined voltage Vclamp as output. Since the gate of each of the second set of transistors P2-1 to P2-N is coupled to the output of voltage generator 14, the second set of transistors P2-1 to P2-N are biased at the predetermined voltage Vclamp. For a PMOS transistor, the source to gate voltage, VSG, and the threshold voltage, |Vth|, determine whether the PMOS transistor is turned on or off. Specifically, a PMOS transistor is turned off if VSG<|Vth|, and is turned on if VSG≥|Vth|. In the present case, whether the second set of transistors P2-1 to P2-N are turned on is determined by the voltage level at the gate (i.e., Vclamp), a voltage level at the source or node B (denoted as VB), and the threshold |Vth|. Taking transistor P2-1 as an example, transistor P2-1 is turned off under the condition below.

$$VSG=VB-Vclamp<|Vth|$$

Accordingly, by rearranging the above equation, if VB is smaller than (Vclamp+|Vth|), transistor P2-1 is turned off. On the contrary, if VB is greater than or equal to (Vclamp+|Vth|), transistor P2-1 is turned on. While VB is subject to change due to different states of a selected cell, the value of Vclamp can be designed by a designer to facilitate a write operation of the memory array through the second set of transistors P2-1 to P2-N.

A cell in an RRAM array may exhibit a set state, which is a low resistance (RL) state, or a reset state, which is a high resistance (RH) state. During a write operation, a selected cell may be switched from RL state to RH state, or vice versa. Nevertheless, overstress in the memory array may occur when VB is relatively high in a write operation. Circuit 10 can function as a buffer to prevent overstress in the memory array, as will be discussed in detail below. For convenience, transistors P1-1 and P2-1 are used as an example in the following discussion.

To switch a selected cell from RL state to RH state, current Iref generated by generator 12 and transistor P1-1 flows from power supply VDD at the source of transistor P1-1 toward node B at the drain of transistor P1-1. Since the selected cell is initially at the RL state, the voltage level at node B substantially equals Iref times RL, as expressed in an equation below.

$$VB = Iref \times RL$$

Since RL is a relatively small value, no overstress can occur in the selected cell. Moreover, the magnitude of Iref as well as Vclamp is designed by the designer so that the product of Iref and RL is smaller than (Vclamp+|Vth|). As a result, VB at this time point is smaller than (Vclamp+|Vth|), and thus transistor P2-1 is turned off.

VB increases as the resistance of the selected cell is switched from the initial RL state to RH state. Without transistor P2-1, VB may substantially increase to Iref times RH, as expressed in an equation below.

$$VB = Iref \times RH$$

The relatively large VB value causes an overstress in the selected cell. However, with transistor P2-1, VB is clamped at a voltage level equal to or slightly greater than (Vclamp+|Vth|), which is enough to turn on transistor P2-1. Accordingly, since transistor P2-1 is turned on, one portion of current Iref flows to transistor P2-1, labeled Ip2, while the other portion of current Iref, labeled Icell, flows to the selected cell. VB at this time point is significantly smaller than (Iref×RH), and does not incur any overstress in the selected cell.

To switch the selected cell from RH state to RL state, current Iref generated by generator 12 and transistor P1-1 flows from power supply VDD at the source of transistor P1-1 toward node B at the drain of transistor P1-1. Since the selected cell is initially at the RH state and RH is a relatively large value, current Iref may mostly flow to transistor P2-1. Transistor P2-1 is turned on and VB is substantially clamped at (Vclamp+|Vth|). As a result, no overstress occurs in the selected cell.

VB decreases as the resistance of the selected cell is switched from the initial RH state to RL state. A significant portion of current Iref flows to the selected cell. As VB decreases below (Vclamp+|Vth|), transistor P2-1 is turned off. VB at this time point substantially equals Iref times RL, and thus does not incur any overstress in the selected cell.

In some embodiments, transistor P1-1 operates at a saturation mode rather than a triode mode so that a larger current Iref is generated. Larger current Iref ensures a deep set state when the resistance of a selected cell is switched to RL state.

Although only transistors P1-1 and P2-1 are discussed, the other transistors P1-2 to P1-N in the first set of transistors and the other transistors P2-1 to P2-N in the second set of transistors function similarly as transistors P1-1 and P2-1, respectively, and thus achieve substantially the same result as transistors P1-1 and P2-1.

Figure 2:
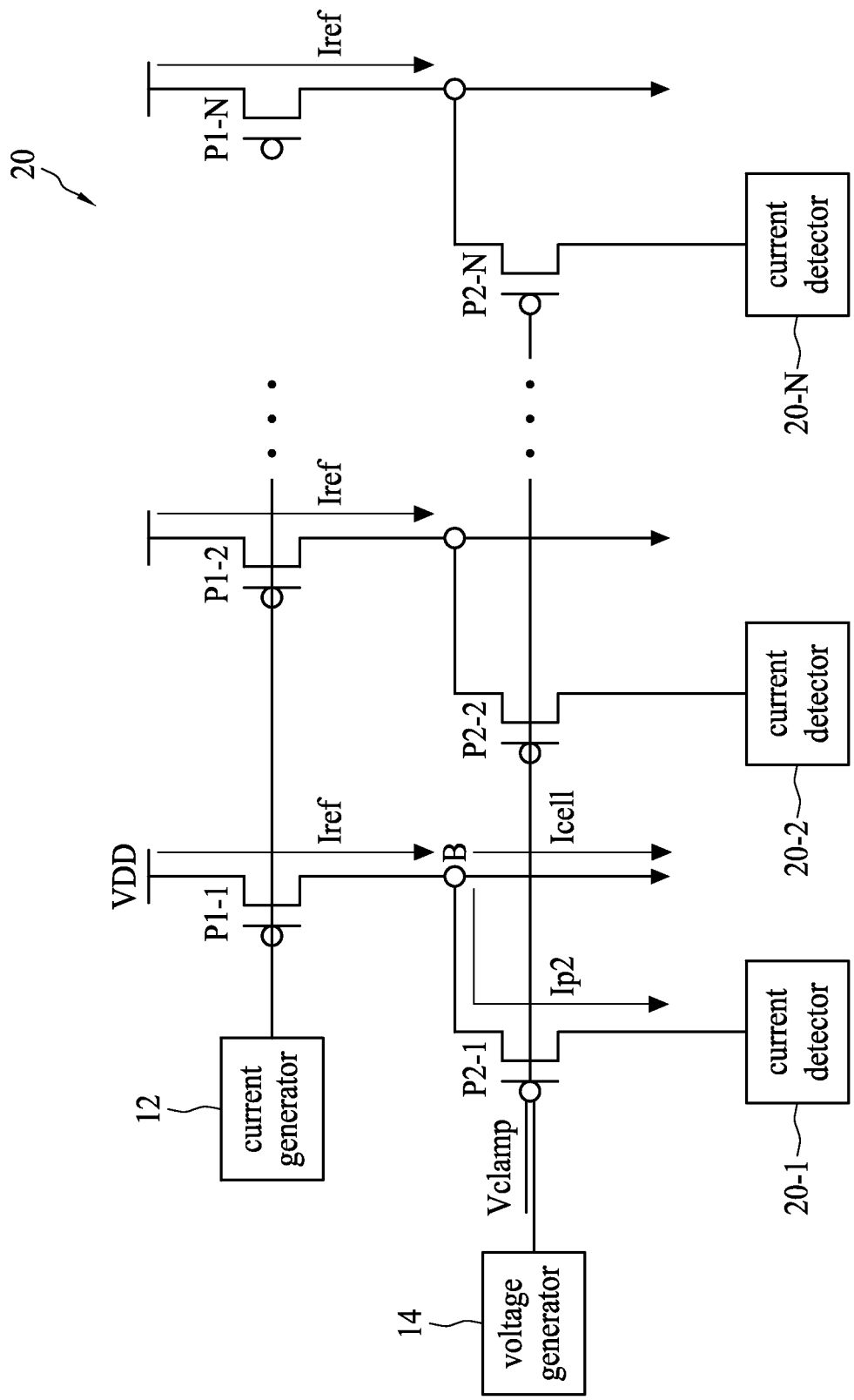
FIG. 2 is a schematic diagram of a circuit in accordance with another embodiment.

FIG. 2 is a schematic diagram of a circuit 20 in accordance with another embodiment. Referring to FIG. 2, circuit 20 is similar to circuit 10 described and illustrated with reference to FIG. 1 except that, for example, circuit 20 further includes detectors 20-1 to 20-N. In some embodiments, detectors 20-1 to 20-N include current detectors. Detectors 20-1 to 20-N are coupled to the drains of the second set of transistors P2-1 to P2-N, respectively. Taking detector 20-1 as an example, detector 20-1 is coupled to the drain of transistor P2-1 and receives current Ip2 flowing from node B via transistor P2-1. Detector 20-1 is configured to determine whether a write operation is done by comparing current Ip2 with a threshold current.

Figure 3:
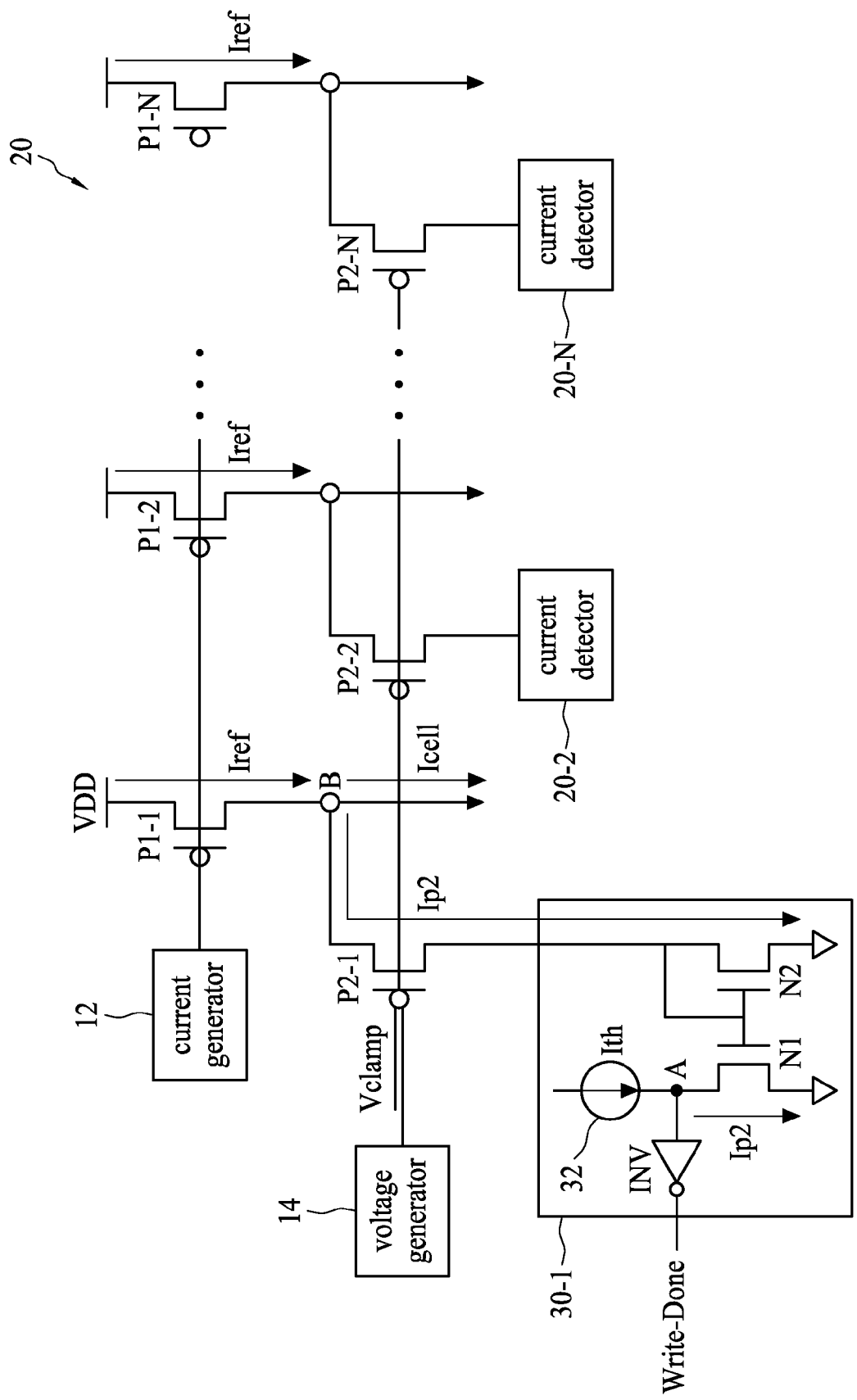
FIG. 3 is a schematic diagram of a detector in the circuit illustrated in FIG. 2 in accordance with some embodiments.

FIG. 3 is a schematic diagram of a detector 30-1 in the circuit 20 illustrated in FIG. 2 in accordance with some embodiments. Referring to FIG. 3, detector 30-1 includes a current generator 32, a first transistor N1, a second transistor N2, and an inverter INV. In some embodiments, first transistor N1 and second transistor N2 include n-type metal-oxide-semiconductor (NMOS) transistors.

Current generator 32 is configured to generate a current Ith flowing toward a node A. Current Ith serves as a threshold in determining whether a write operation associated with a selected cell is done.

A gate (not numbered) of first transistor N1 is coupled to the drain of transistor P2-1. A drain of first transistor N1 receives current Ith at node A and is coupled to an input of inverter INV. A source (not numbered) of transistor N1 receives a reference voltage, for example, ground.

A gate (not numbered) of second transistor N2 is coupled to the gate of first transistor N1 and to the drain of transistor P2-1. A drain (not numbered) of second transistor N2 receives current Ip2 from transistor P2-1, and is coupled to the gates of transistors N1 and N2. A source (not numbered) of second transistor N2 receives the reference voltage.

First transistor N1 and second transistor N2 together form a current mirror. Moreover, second transistor N2 mirrors current Ip2 in first transistor N1.

In operation, when a selected cell is switched from RL state to RH state, if current Ip2 is smaller than current Ith, the voltage level at node A, denoted as VA, is logically low. By function of inverter INV, a signal Write-Done at an output of inverter INV is logically high, indicating that a write operation to switch the selected cell to RH state is done. On the contrary, if current Ip2 is greater than or equal to current Ith, then VA is logically high. By function of inverter INV, signal Write-Done at the output of inverter INV is logically low, indicating that a write operation to switch the selected cell to RH state is not done.

Furthermore, when the selected cell is switched from RH state to RL state, if current Ip2 is greater than current Ith, then VA is logically low. By function of inverter INV, signal Write-Done at the output of inverter INV is logically high, indicating that a write operation to switch the selected cell to RL state is not done. On the contrary, if current Ip2 is smaller than or equal to current Ith, then VA is logically high. By function of inverter INV, signal Write-Done at the output of inverter INV is logically low, indicating that a write operation to switch the selected cell to RL state is done.

Figure 4:
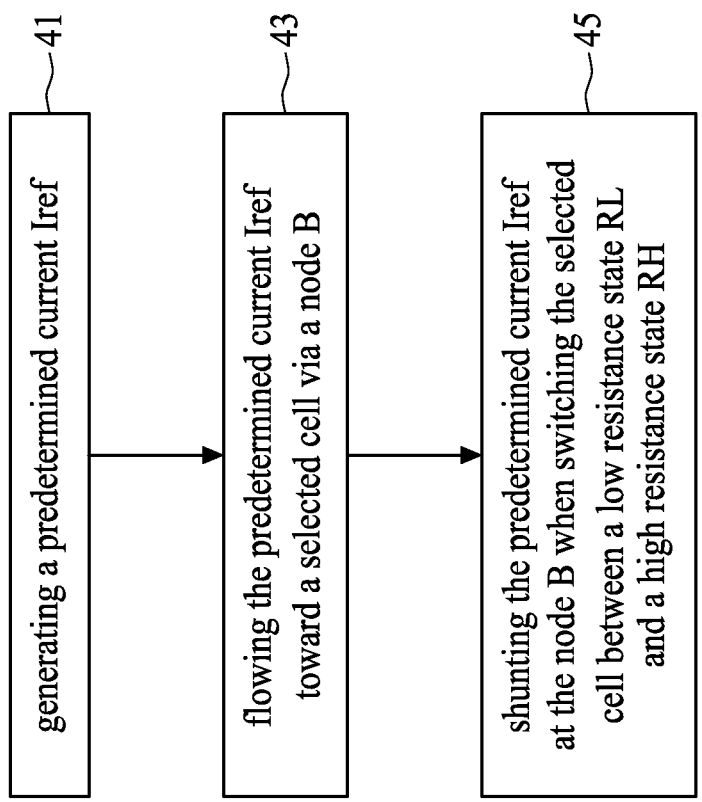
FIG. 4 is a flow diagram illustrating a method in accordance with some embodiments.

FIG. 4 is a flow diagram illustrating a method in accordance with some embodiments. Referring to FIG. 4, at operation 41, a predetermined current Iref is generated by a current generating circuit including current generator 12 and a first set of transistors P1-1 to P1-N.

At operation 43, the predetermined current Iref is flown toward a selected cell in a memory array via node B. The voltage level at node B, or VB, concerns whether the selected cell is overstressed when switched between a low resistance state RL and a high resistance state RH.

At operation 45, the predetermined current Iref is shunt by one of a second set of transistors P2-1 to P2-N when switching the selected cell between RL state and RH state. Specifically, to switch the selected cell from RL state to RH state, the one of a second set of transistors P2-1 to P2-N is turned off when the selected cell is initially at the RL state, and is turned on to clamp VB at substantially (Vclamp+|Vth|) as the selected cell is switched to RH state. Furthermore, to switch the selected cell from RH state to RL state, the one of a second set of transistors P2-1 to P2-N is turned on to clamp VB at substantially (Vclamp+|Vth|) when the selected cell is initially at the RH state, and is turned off as the selected cell is switched to RL state. Effectively, the overstress issue with the selected issue is addressed.

In some embodiments of the present disclosure, circuit 10 or 20 comprising current generator 12 and voltage generator 14 is provided. Current generator 12 is configured to generate predetermined current Iref flowing toward a selected cell in a memory array via node B during a write operation. Voltage generator 14 is configured to generate predetermined voltage Vclamp. The voltage level VB at node B is clamped at a predetermined value associated with predetermined voltage Vclamp as the selected cell is switched between low resistance state RL and high resistance state RH during the write operation.

In other embodiments of the present disclosure, circuit 10 or 20 comprising a first current mirror (12, P1-1) and first transistor P2-1 is provided. First current mirror is configured to generate a predetermined current Iref flowing toward a selected cell in a memory array. Node B is positioned between first current mirror and the selected cell. First transistor P2-1 includes a gate biased at predetermined voltage Vclamp and a source coupled to node B, and is configured to clamp the voltage level VB at node B as the selected cell is switched between low resistance state RL and high resistance state RH.

Some embodiments of the present disclosure also provide a method. The method comprises generating predetermined current Iref, flowing the predetermined current toward a selected cell in a memory array via node B during a write operation, and shunting predetermined current Iref at node B when switching the selected cell between low resistance state RL and high resistance state RH during the write operation.

A number of embodiments of the disclosure have been described. It will nevertheless be understood that various modifications may be made without departing from the spirit and scope of the disclosure. For example, some transistors are shown to be N-type and some others are shown to be P-type, but the disclosure is not limited to such a configuration because selecting a transistor type (e.g., NMOS, PMOS) is a matter of design choice based on need, convenience, etc. Embodiments of the disclosure are applicable in variations and/or combinations of transistor types. Additionally, some signals are illustrated with a particular logic level, but selecting such levels are also a matter of design choice, and embodiments of the disclosure are applicable in various design choices.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A circuit, comprising:
   a current generator configured to generate a predetermined current flowing toward a selected cell in a memory array via a node during a write operation;
   a voltage generator configured to generate a predetermined voltage; and
   a first transistor configured to shunt the predetermined current at the node,
   wherein the voltage level at the node is clamped at a predetermined value associated with the predetermined voltage and the predetermined current is shunted through the first transistor as the selected cell is switched between a low resistance state and a high resistance state during the write operation.

2. The circuit of claim 1 further comprising a first set of transistors, wherein the current generator and the first set of transistors form a current mirror circuit.

3. The circuit of claim 2, wherein a gate of each of the first set of transistors is coupled to an output of the current generator, and a drain of one of the first set of transistors is coupled to the node.

4. The circuit of claim 2, wherein one of the first set of transistors is configured to operate in a saturation mode.

5. The circuit of claim 1 further comprising a plurality of transistors to form, inclusive of the first transistor, a second set of transistors, wherein a gate of each of the second set of transistors receives the predetermined voltage, and a source of one of the second set of transistors is coupled to the node.

6. The circuit of claim 5 further comprising a detector coupled to a drain of one of the second set of transistors, wherein the detector is configured to determine whether a write operation associated with a selected cell is done.

7. The circuit of claim 6, wherein the detector compares a shunt current in the one of the second set of transistors with a threshold current.

8. The circuit of claim 1, wherein the voltage level at the node is clamped at Vclamp+|Vth|, wherein Vclamp is the predetermined value and |Vth| is the threshold voltage of the second set of transistors.

9. A circuit, comprising:
   a first current mirror configured to generate a predetermined current flowing toward a selected cell in a memory array;
   a node between the first current mirror and the selected cell;
   a first transistor including a gate biased at a predetermined voltage and a source coupled to the node, the first transistor configured to clamp the voltage level at the node and the predetermined current shunted through the first transistor at the node as the selected cell is switched between a low resistance state and a high resistance state.

10. The circuit of claim 9, wherein the first current mirror includes a current generator and a second transistor.

11. The circuit of claim 10, wherein the second transistor includes a gate coupled to an output of the current generator, and a drain coupled to the node.

12. The circuit of claim 10, wherein the second transistor is configured to operate in a saturation mode.

13. The circuit of claim 9 further comprising a voltage generator configured to generate the predetermined voltage.

14. The circuit of claim 9 further comprising a detector configured to compare a shunt current in the first transistor with a threshold current.

15. The circuit of claim 14, wherein the detector includes a second current mirror configured to generate the threshold current.

16. The circuit of claim 9, wherein the voltage level at the node is clamped at Vclamp+|Vth|, wherein Vclamp is the predetermined value and |Vth| is the threshold voltage of the first transistor.

17. A method, comprising:
generating a predetermined current;
flowing the predetermined current toward a selected cell in a memory array via a node during a write operation; and
shunting the predetermined current through a transistor at the node when switching the selected cell between a low resistance state and a high resistance state during the write operation.

18. The method of claim 17, wherein the voltage level at the node is clamped at a predetermined value by shunting the predetermined current at the node.

19. The method of claim 18, wherein the voltage level at the node is clamped at Vclamp+|Vth|, wherein Vclamp is a predetermined voltage for biasing a gate of the transistor and |Vth| is the threshold voltage of the transistor configured to shunt the predetermined current.

20. The method of claim 19 further comprising determining whether the write operation associated with the selected cell is done by comparing the shunt predetermined current with a threshold current.

* * * * *